(12) United States Patent
Matsubara

(10) Patent No.: US 6,890,852 B2
(45) Date of Patent: May 10, 2005

(54) SEMICONDUCTOR DEVICE AND MANUFACTURING METHOD OF THE SAME

(75) Inventor: Yoshihisa Matsubara, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/624,596

(22) Filed: Jul. 23, 2003

(65) Prior Publication Data

US 2004/0053446 A1 Mar. 18, 2004

Related U.S. Application Data

(62) Division of application No. 09/290,259, filed on Apr. 13, 1999, now abandoned.

(30) Foreign Application Priority Data

Apr. 17, 1998 (JP) .............................. 10-107514

(51) Int. Cl.⁷ .......................................... H01L 21/4763
(52) U.S. Cl. ........................ 438/637; 438/672; 438/687
(58) Field of Search ................................ 438/637, 672, 438/687, 622, 624

(56) References Cited

U.S. PATENT DOCUMENTS

| | | | |
|---|---|---|---|
| 4,263,606 A | 4/1981 | Yorikane | |
| 5,372,974 A | 12/1994 | Doan et al. | |
| 5,656,860 A | 8/1997 | Lee | |
| 5,882,738 A * | 3/1999 | Blish et al. | ........... 427/526 |
| 5,900,672 A | 5/1999 | Chan et al. | |
| 5,903,053 A | 5/1999 | Iijima et al. | |
| 5,953,634 A | 9/1999 | Kajita et al. | |
| 5,956,612 A | 9/1999 | Elliot et al. | |
| 5,965,942 A | 10/1999 | Itoh et al. | |
| 5,969,422 A | 10/1999 | Ting et al. | |
| 5,973,400 A | 10/1999 | Murakami et al. | |
| 5,981,374 A | 11/1999 | Dalal et al. | |
| 6,013,578 A | 1/2000 | Jun | |
| 6,028,360 A | 2/2000 | Nakamura et al. | |
| 6,037,250 A | 3/2000 | Matsubara | |
| 6,040,240 A | 3/2000 | Matsubara | |
| 6,057,232 A | 5/2000 | Lee | |
| 6,077,780 A * | 6/2000 | Dubin | ................. 438/687 |
| 6,130,161 A | 10/2000 | Ashley et al. | |

FOREIGN PATENT DOCUMENTS

| | | |
|---|---|---|
| EP | 0 269 211 | 6/1988 |
| EP | 0 751 566 | 1/1997 |

(Continued)

OTHER PUBLICATIONS

"International Reliability Physics Symposium", 1997 Tutorial Notes, pp. 3.30–3.33, *IEEE*.

Primary Examiner—Hoai Pham
Assistant Examiner—Ginette Peralta
(74) Attorney, Agent, or Firm—Young & Thompson

(57) ABSTRACT

A semiconductor device is improved in adhesion between: at least a contact portion of its tantalum-base metal serving as a barrier metal film; and, its copper buried wiring brought into contact with the contact portion to prevent the copper buried wiring from peeling off, and is therefore improved in reliability. Formed in a trench designed for a buried wiring of an interlayer insulation film are: a tantalum film having a film thickness of from 200 to 500 angstroms; and, a copper buried wiring having a film thickness of from 1.1 to 1.55 μm. This copper buried wiring is formed by stacking together a copper thin film having a film thickness of from 0.08 to 0.12 μm and a copper thick film having a film thickness of from 1.0 to 1.5 μm. Further formed between the tantalum film and the copper buried wiring is an amorphous metal film having a thickness of approximately angstroms. Still further formed between the tantalum film and each of a surface protection film and an interlayer insulation film is a tantalum oxide film having a film thickness of approximately several angstroms.

3 Claims, 9 Drawing Sheets

FOREIGN PATENT DOCUMENTS

| | | |
|---|---|---|
| EP | 0 856 884 | 8/1998 |
| EP | 0 869 544 | 10/1998 |
| EP | 0 875 924 | 11/1998 |
| EP | 0 811 673 | 12/1998 |
| JP | 1202841 | 8/1989 |
| JP | 758201 | 3/1995 |
| JP | 8139090 | 5/1996 |
| JP | 9-186157 | 7/1997 |
| JP | 10-209156 | 8/1998 |
| JP | 11135504 | 5/1999 |
| WO | WO 99/09593 | 2/1999 |

\* cited by examiner

4: trench for buried wiring  14: resist film

15: chamber

10: copper thick film
9: copper thin film
} 8: copper buried wiring

4: trench for buried wiring
6: tantalum film
11: tantalum oxide film

SEMICONDUCTOR DEVICE AND MANUFACTURING METHOD OF THE SAME This application is a division of application Ser. No. 09/290,259, filed on Apr. 13, 1999 now abandoned, the entire contents of which are hereby incorporated by reference.

BACKGROUND OF THE INVENTION

1. Field of the Invention

The present invention relates to a semiconductor device and a manufacturing method of the same, and more particularly to a semiconductor device and a manufacturing method of the same, wherein: an interlayer insulation film is provided with a contact hole, a via hole, or with a trench designed for a buried wiring; and, the contact hole, the via hole, or the trench designed for the buried wiring is filled with copper or a copper-base conductive material through a barrier metal film of a tantalum-base metal to form a plug electrode or the buried wiring.

2. Description of the Related Art

In semiconductor devices typified by large scale integrated circuits (LSIs) such as memories, microprocessors and the like, the more the devices increase in integration density, the finer in dimension, and, therefore finer their dimension in their individual semiconductor regions forming various elements. Further, in forming a plug electrode or a buried wiring in each of these semiconductor regions, a contact hole, a via hole, or a trench designed for a buried wiring formed in the interlayer insulation film becomes finer in diameter. In addition, since the wiring density increases, a so-called multilevel interconnection technique for producing a multi-layer wiring stacked in the width direction of a semiconductor substrate has been developed.

The great majority of such LSIs is of MOS (Metal Oxide Semiconductor) type, which is constructed of MOS type transistors. Such MOS type LSI is hereinafter referred to simply as the LSI. In such LSI, more particularly, in the LSI which is high in processing speed, when a plug electrode or a buried wiring is formed in a contact hole, a via hole, or a trench designed for such buried wiring, a resistance of the wiring becomes a problem in operation. Due to this problem, a wiring having a small resistance is required. FIG. 16 is a characteristic graph, which outlines the relationship between a width of the wiring, i.e., wiring width (graduated on an x-axis of the graph) and a resistance of the wiring, i.e., wiring resistance (graduated on a y-axis of the graph). In this drawing, the wiring resistance is inversely proportional to the wiring width. Incidentally, in the same drawing, a characteristic curve indicated by a dotted line shows a processing speed of the LSI.

Heretofore, as a wiring material designed for the semiconductor device including the LSIs, an aluminum-base metal containing aluminum as its major component has been used. This type of aluminum-base metal has a resistivity of from 2.8 to 3.0 $\mu\Omega$cm. However, as long as the wiring is made of such aluminum-base metal, the LSI is restricted in processing speed within narrow limits which depend on the resistivity of the aluminum-base metal. Consequently, in order to improve the LSI in processing speed, it is necessary to use, as a material of the wiring, a conductive material smaller in resistivity than the aluminum-base metal. From the above standpoint, in place of such aluminum-base metal, copper (i.e., Cu) has been used. Copper has a resistivity of from 1.9 to 2.2 $\mu\Omega$cm, which is much lower than that of the aluminum-base metal.

Next, an example for forming a buried wiring with the use of copper will be described. In this example, an interlayer insulation film, which is made of silicon oxides (for example, such as $SiO_2$ and the like) and provided with a trench designed for a buried wiring, is previously formed on a semiconductor substrate. Then, a copper thin film is formed on such semiconductor substrate by a sputter process and like processes. Subsequent to this, a copper thick film is formed on the copper thin film by plating. The reason why the copper films are formed in two stages is that it is necessary to form a copper wiring with a sufficient film thickness within a fine contact hole.

On the other hand, after completion of formation of these copper films, the semiconductor substrate is subjected to a heat treatment. In this heat treatment, a phenomenon that copper diffuses into the interlayer insulation film occurs.

As a result, many disadvantages are brought about by the above diffusion of copper into the interlayer insulation film. For example: the interlayer insulation film becomes poor in insulation properties; the wiring resistance increases; and, the wiring tends to break. In order to remove the above disadvantages, a barrier metal film is previously formed on the interlayer insulation film, and then copper is applied onto this barrier metal film to prevent the copper thus applied from diffusing into the interlayer insulation film.

For example, disclosed as such barrier metal film in the applicant's cited literature "International Reliability Physics Symposium 1997 Tutorial Notes, Pages 3.30–3.32" is a high melting-point metal film made of tantalum-base metal such as tantalum silicon nitride (TaSiN), tantalum nitride (TaN) and the like. The barrier metal film made of the tantalum-base metal has the excellent properties of being stable in adverse environments where the semiconductor device such as the LSIs and the like is used and subjected to wide temperature variations.

Next, problems to be solved by the present invention will be described. The tantalum-base metal as the barrier metal film disclosed in the above literature is poor in adhesion to a copper wiring formed thereon, which increases the tendency of the copper wiring to peel off, and, therefore decreases the reliability of the semiconductor device such as the LSIs and the like.

In other words, in forming the copper wiring, as described above, immediately after being formed, the copper films have an unwanted hillock or bump portion of its copper thick film surface subjected to a CMP (i.e., Chemical Mechanical Polishing) process to polish away such unwanted lump portion. At this time, the copper film tends to peel off. The reason why the copper film tends to peel off seems to be that an abrasive liquid used in the above CMP process passes through a low-adhesion or gap portion of the semiconductor wafer to enter the interior of the wafer, so that a connection portion of the copper wiring with the barrier metal film is eroded. Due to this, the wiring has a large resistance. Further, the semiconductor device provided with such barrier metal film becomes poor in resistance to both stressmigration and electromigration.

FIG. 17 is a schematic characteristic graph representing the relationship between the wiring width and the wiring resistance, obtained in the conventional semiconductor device. As is clear from this graph, as the wiring width decreases, the wiring resistance steeply increases.

The reason why adhesion between the tantalum-base metal and the copper wiring is poor seems to be that the tantalum-base metal formed by a sputter process and like processes receives no aftercare. Due to this, a stress occurs in the copper wiring—far more than in the tantalum-base metal, which leads to a peeling-off phenomenon of the copper wiring.

Further, in the above-mentioned conventional technique, adhesion between the tantalum-base metal and an interlayer insulation film disposed thereunder is also poor. The reason why it is so seems to be the same as that of the above.

SUMMARY OF THE INVENTION

In view of the above problems, it is an object of the present invention to provide a semiconductor device and a manufacturing method of the same, wherein a connection portion of a tantalum-based metal as a barrier metal film with a copper wiring is improved ,in adhesion to prevent the copper wiring from peeling off, so that the semiconductor device is improved in reliability.

According to a first aspect of the present invention, there is provided a semiconductor device having a construction in which an interlayer insulation film is provided with a contact hole, a via hole, or with a trench designed for a buried wiring on a semiconductor substrate, wherein the contact hole, the via hole, or the trench designed for the buried wiring is filled with copper or a copper-based conductive material through a barrier metal film made of a tantalum-based metal to form a plug electrode or the buried wiring, the improvement wherein:

an amorphous metal film containing at least the tantalum and copper is formed between the barrier metal film and the conductive material.

In the foregoing, a metal oxide film containing at least tantalum may be formed between the barrier metal film and the interlayer insulation film.

Further, it is preferable that the amorphous metal film has a film thickness of from 20 to 500 angstroms.

Still further, a mode is a desirable in which the conductive material is filled in the trench designed for the buried wiring to form the buried wiring; and, a bump-like external electrode may be formed in an end portion of the conductive material.

According to a second aspect of the present invention, there is provided a manufacturing method of a semiconductor device having a construction, formed in which is an interlayer insulation film which is provided with a contact hole, a via hole, or with a trench designed for a buried wiring on a semiconductor substrate, wherein the contact hole, the via hole, or the trench designed for the buried wiring is filled with copper or a copper-base conductive material through a barrier metal film made of a tantalum-base metal to form a plug electrode or the buried wiring; an amorphous metal film containing at least the tantalum and copper is formed between the barrier metal film and the conductive material; and, a metal oxide film containing at least tantalum is formed between the barrier metal film and the interlayer insulation film, the method comprising the steps of:

preparing a semiconductor substrate, formed in which is an interlayer insulation film provided with a contact hole, a via hole, or with a trench designed for a buried wiring;

forming a barrier metal film made of a tantalum-base metal in a contact hole, a via hole, or in a trench designed for a buried wiring;

forming a conductive thin film made of a conductive material on the barrier metal film, the conductive material having copper or a copper-base substance as its predominant component;

forming a conductive thick film made of a conductive material on the conductive thin film, the conductive material having copper or a copper-base substance as its predominant component;

heat-treating the semiconductor substrate in a non-oxidizing atmosphere; and planarizing the conductive thick film by polishing the surface of the thick film.

In the foregoing, in the step of forming the conductive thick film, the thick film may be formed by plating.

Further, in the step of planarizing the conductive thick film, planarization of the thick film may be carried out by a chemical mechanical polishing process.

Still further, in the step of heat-treating the semiconductor device, the semiconductor device may be heat-treated at a heat-treatment temperature of from 400 to 700° C. for a heat-treatment period of from 2 to 20 minutes.

With the semiconductor device and the manufacturing method thereof, since the amorphous metal film is formed between: the tantalum-base metal serving as a barrier metal film; and, the conductive material comprising copper or copper-base metal as its essential component, the tantalum-base metal is brought into more intimate contact with the conductive material. Consequently, it is possible to prevent the conductive material from peeling off, which improves the semiconductor device in reliability.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Now, the present invention will be described in detail with reference to the accompanying drawings. The description will be made in more concrete manner using embodiments of the present invention.

Figure 1:
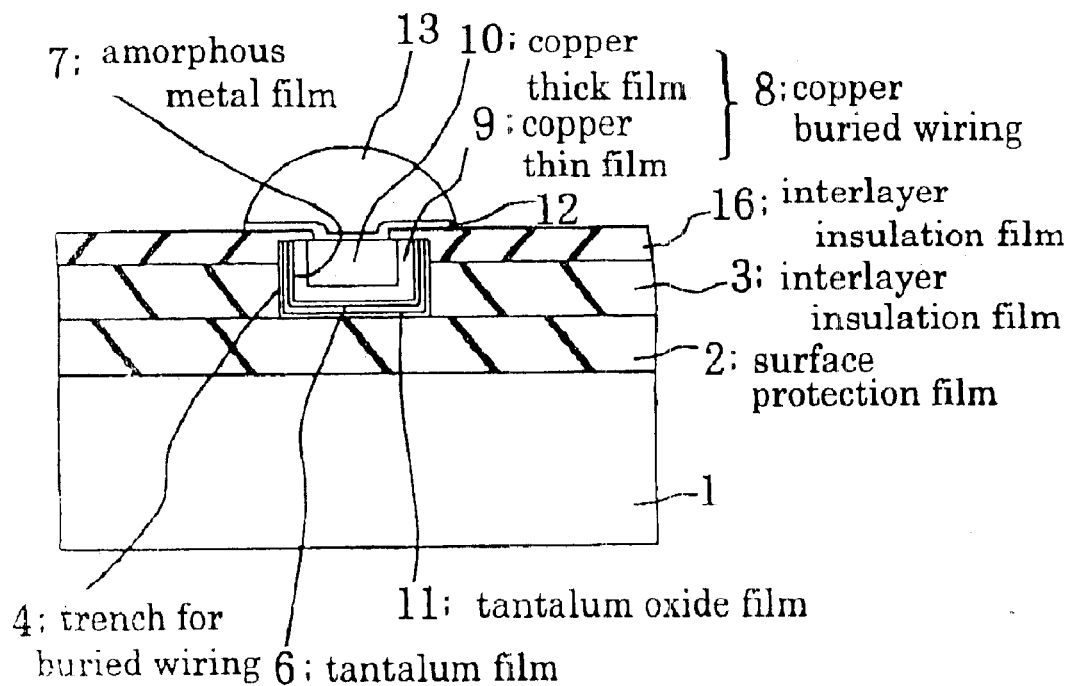
FIG. 1 is a cross-sectional view of a semiconductor device of a first embodiment of the present invention.
Figure 2:
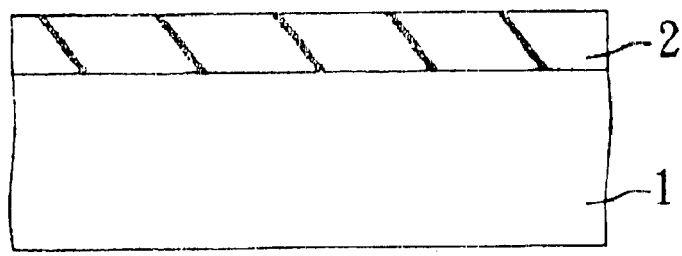
FIG. 2 is a cross-sectional view of the semiconductor device of the present invention shown in FIG. 1, illustrating the manufacturing method of the semiconductor device.

FIG. 1 shows a semiconductor device of a first embodiment of the present invention. FIGS. 2 to 8 sequentially show a series of process steps of a manufacturing method of the semiconductor device of the present invention in the order of these process steps.

As shown in the drawings, in this embodiment of the semiconductor device, a surface protection film 2 of silicon oxide having a film thickness of, from 0.5 to 1.5 $\mu$m is formed on a semiconductor substrate made of, for example such as silicon and the like. Formed on this surface protection film 2 is an interlayer insulation film 3 of silicon oxide having a film thickness of from 0.8 to 1.5 $\mu$m. Formed in this interlayer insulation film 3 is a trench 4 which is designed for a buried wiring and having a diameter of approximately 25 $\mu$m. Further, formed on the interlayer insulation film 3 is another interlayer insulation film 16 of silicon nitride ($Si_3N_4$) having a film thickness of from 0.08 to 0.20 $\mu$m. The device regions of desired conductive types are formed in the semiconductor substrate's positions not shown in the drawings.

Formed in the trench 4 designed for the buried wiring are: a tantalum film 6 having a film thickness of from 200 to 500 angstroms; and, a copper buried wiring 8 having a film thickness of from 1.1 to 1.55 $\mu$m. This copper buried wiring 8 is constructed of: a copper thin film 9 having a film thickness of from 0.08 to 0.12 $\mu$m; and a copper thick film 10 having a film thickness of from 1.0 to 1.5 $\mu$m, which films 9, 10 are stacked together. Further, formed between the tantalum film 6 and the copper buried wiring 8 is an amorphous metal film 7 having a film thickness of approximately 20 angstroms. Formed between the tantalum film 6 and each of the surface protection film 2 and the interlayer insulation film 3 is a tantalum oxide film 11 having a film thickness of several angstroms.

The amorphous metal film 7 contains at least tantalum and copper. This amorphous metal film 7 has a minimum film thickness of approximately 20 angstroms, and is capable of being formed over substantially the entire area of the tantalum film 6. Namely, the amorphous metal film 7 is capable of being formed so as to have a maximum film thickness of approximately 500 angstroms. Further, the tantalum oxide film 11 contains tantalum compounds represented by "$TaSi_x$" and "$TaN_x$" in addition to tantalum compounds represented by "$TaO_x$".

A solder layer 12 containing lead (Pb) and tin (Sn) is connected with an end portion of the copper buried wiring 8, and formed in a manner such that it extends from a part of a surface of the interlayer insulation film 16. Formed on this solder layer 12 is a bump electrode 13 of copper. This bump electrode 13 is used as an implementing electrode when the semiconductor device is implemented on the wiring substrate by a flip chip method.

Next, a manufacturing method of the semiconductor device of this embodiment will be described with reference to FIGS. 2 to 8.

Figure 3:
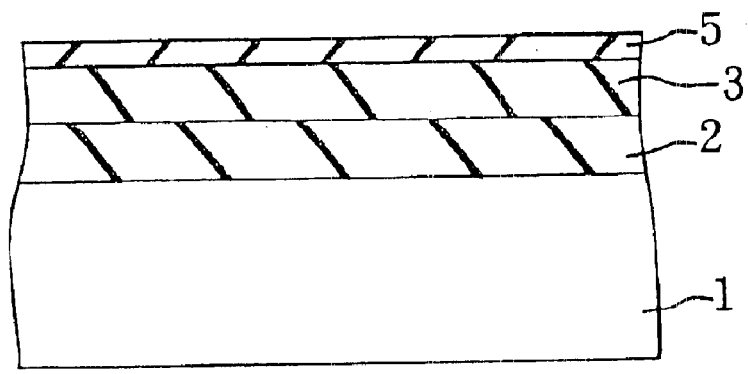
FIG. 3 is a cross-sectional view of the semiconductor device of the present invention shown in FIG. 1, illustrating the manufacturing method of the semiconductor device.

First, as shown in FIG. 3, after the interlayer insulation film 3 of silicon oxide having a film thickness of from 0.8 to 1.5 $\mu$m is formed on the interlayer insulation film 2 by a CVD process, another interlayer insulation film 5 of silicon nitride having a film thickness of from 0.05 to 0.12 $\mu$m is formed on the above interlayer insulation film 3. As will be hereinafter described, this interlayer insulation film 5 is used as a stopper when the copper thick film is subjected to a CMP (i.e., Chemical Mechanical Polishing) process.

Figure 4:
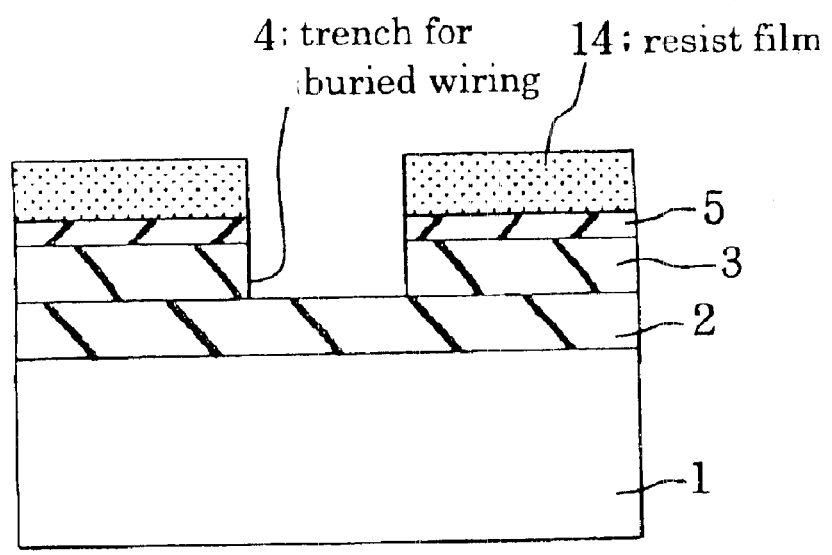
FIG. 4 is a cross-sectional view of the semiconductor device of the present invention shown in FIG. 1, illustrating the manufacturing method of the semiconductor device.

Then, as shown in FIG. 4, using a photolithography technology, a region requiring the interlayer insulation film 5 is masked off with a resist film 14. After that, a region not requiring the interlayer insulation films 5, 3 is removed by a dry etching process so that the trench 4 designed for the buried wiring is formed, which trench 4 has a diameter of approximately 0.25 $\mu$m.

Figure 5:
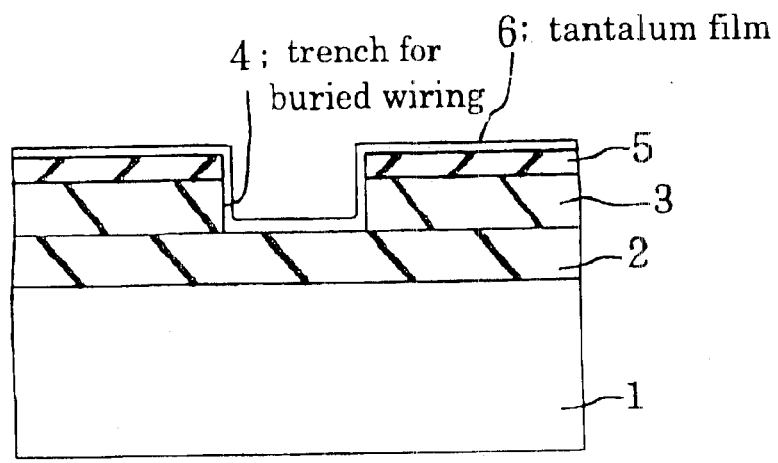
FIG. 5 is a cross-sectional view of the semiconductor device of the present invention shown in FIG. 1, illustrating the manufacturing method of the semiconductor device.

Next, as shown in FIG. 5, after removal of the resist film 14, using a sputter method, a tantalum film 6 having a film thickness of from 200 to 500 angstroms is formed on both the trench 4 designed for the buried wiring and the interlayer insulation film 5.

Figure 6:
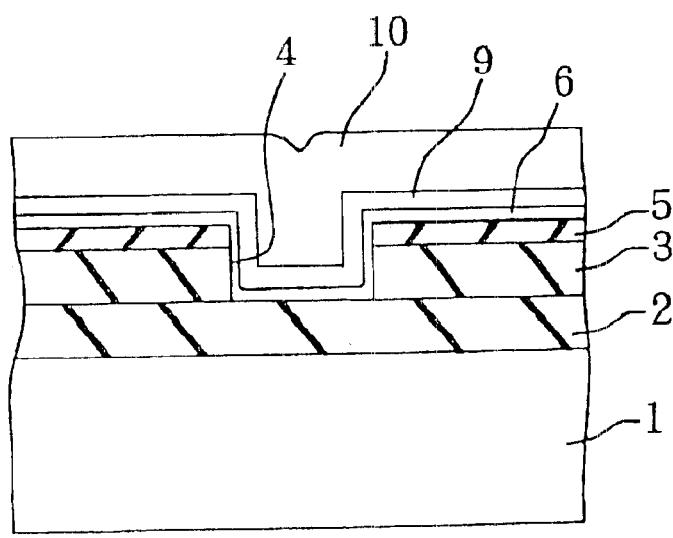
FIG. 6 is a cross-sectional view of the semiconductor device of the present invention shown in FIG. 1, illustrating the manufacturing method of the semiconductor device.

Then, as shown FIG. 6, using the sputter method, the copper thin film 9 having a film thickness of from 0.08 to 0.12 $\mu$m is formed. Subsequent to this, the copper thick film 10 having a film thickness of from 1.0 to 1.5 $\mu$m is formed on the copper thin film 9 by plating. The copper thick film 10 is so formed as to extend outwardly from the trench 4 designed for the buried wiring.

The reason why the copper films are formed in two stages is that it is necessary to form a copper buried wiring having a sufficient film thickness in the trench 4 designed for the buried wiring.

Figure 7:
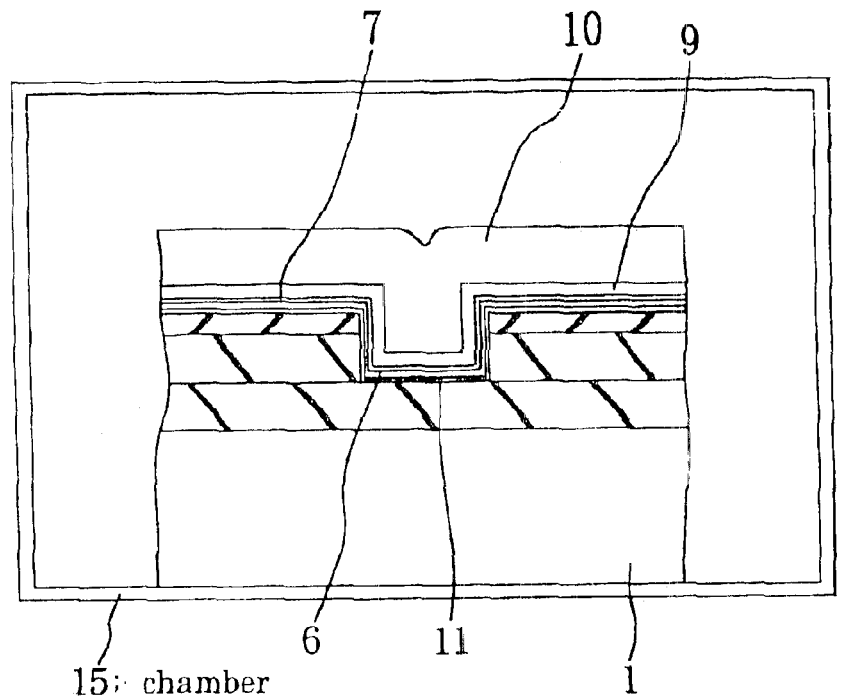
FIG. 7 is a cross-sectional view of the semiconductor device of the present invention shown in FIG. 1, illustrating the manufacturing method of the semiconductor device.

Next, as shown in FIG. 7, the semiconductor substrate 1 is received in a chamber 15, and then subjected to a heat treatment at a temperature of approximately 400° C. for approximately 20 minutes. As a result, the tantalum film 6 reacts with the copper thin film 9 to form therebetween the amorphous metal film 7 having a film thickness of approximately 20 angstroms. At the same time, the tantalum film 6 reacts with silicon oxide forming each of the surface protection film 2 and the interlayer insulation film 3 to form therebetween the tantalum oxide film 11 having a film thickness of approximately several angstroms.

As described above, since the amorphous metal film 7 is formed between the tantalum film 6 and the copper thin film 9, the tantalum film 6 is brought into more intimate contact with the copper thin film 9. In the same way, since the tantalum oxide film 11 is formed between the tantalum film 6 and each of the surface protection film 2 and the interlayer insulation film 3, the tantalum film 6 is brought into more intimate contact with each of the surface protection film 2 and the interlayer insulation film 3.

Figure 8:
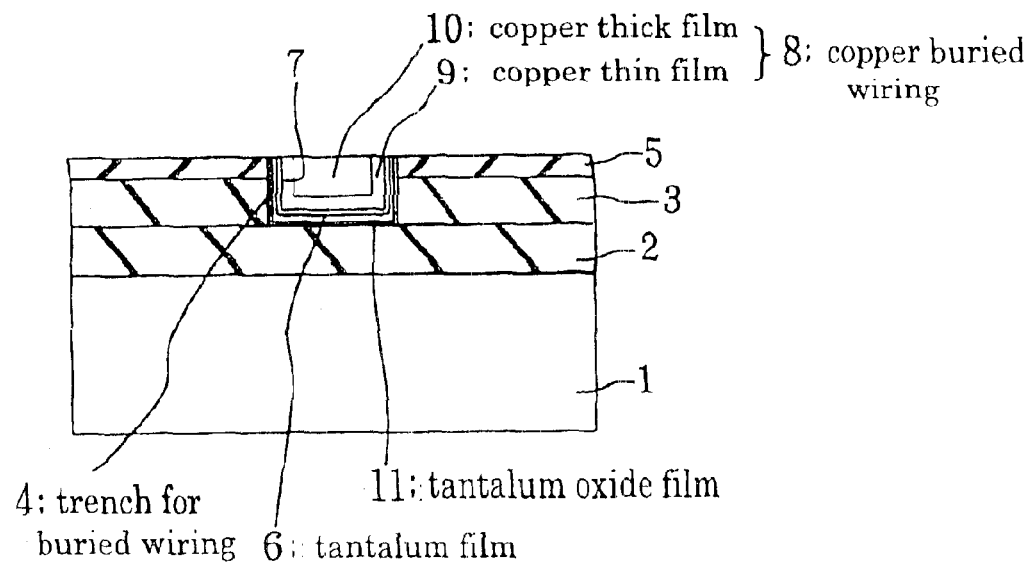
FIG. 8 is a cross-sectional view of the semiconductor device of the present invention shown in FIG. 1, illustrating the manufacturing method of the semiconductor device.

Then, as shown in FIG. 8, using the CMP (i.e., Chemical Mechanical Polishing) process, the unwanted lump portion in surface of the copper thick film 10 disposed outside the trench 4 designed for the buried wiring is polished away so that planarization to a common level is achieved. In this polishing treatment, since the interlayer insulation film 5 of silicon nitride serves as a stopper, polishing operation stops at the surface of this interlayer insulation film 5. As a result, the copper buried wiring 8 is formed in the trench 4 designed for the buried wiring.

Figure 9:
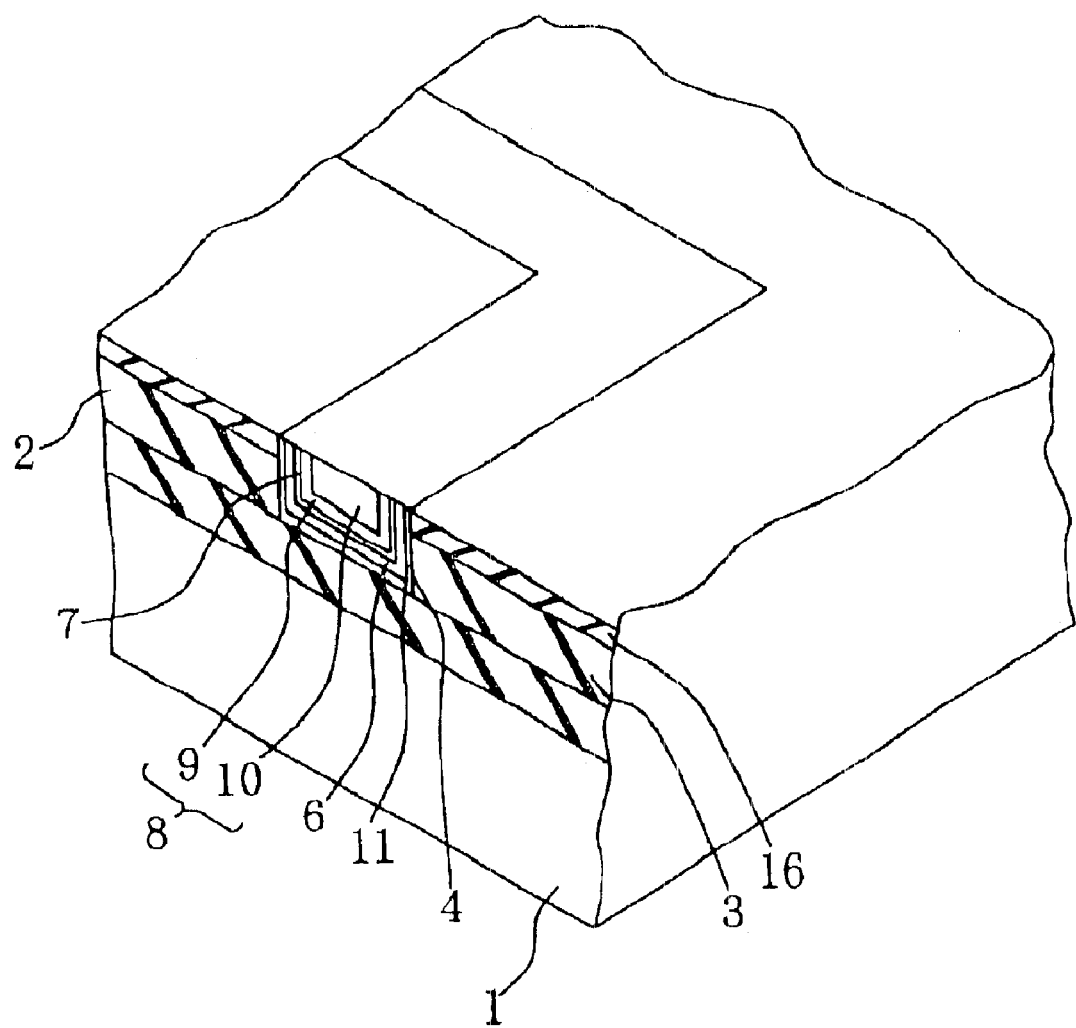
FIG. 9 is a perspective view of the semiconductor device of the present invention shown in FIG. 1, illustrating a cross-sectional view of a copper buried wiring.

FIG. 9 is a perspective view of the copper buried wiring 8 in the above stage in process, wherein the copper buried wiring 8 is formed along the trench 4 which is formed in the interlayer insulation film 3 disposed on the semiconductor substrate 1. Through the copper buried wiring 8, the respective regions of devices formed on the semiconductor substrate 1 are connected with each other, or, the regions of devices are connected with other copper buried wirings, or, other copper buried wirings are connected with each other.

Figure 10:
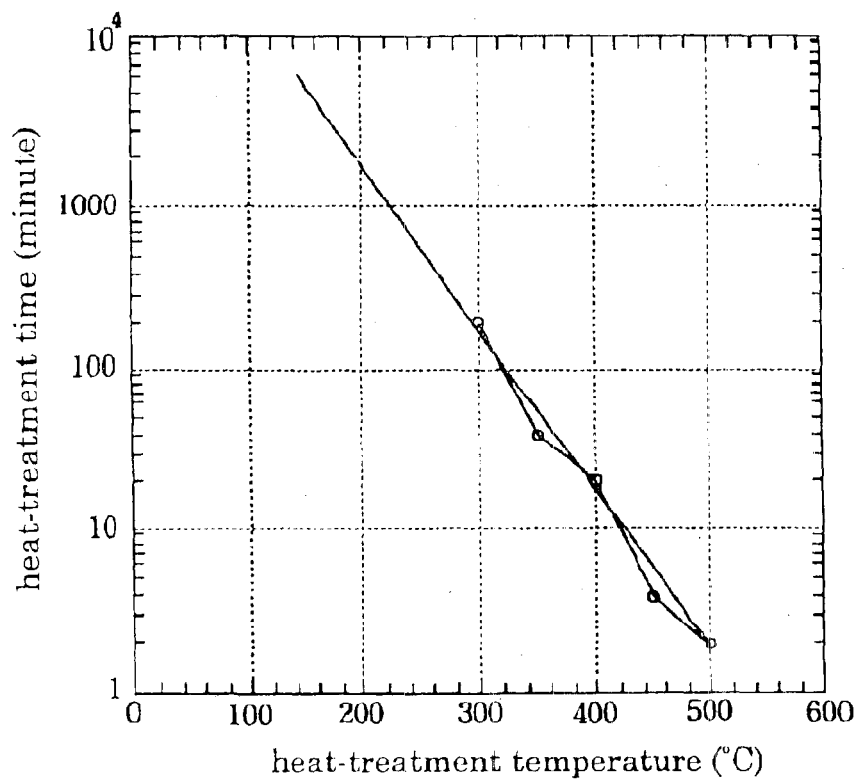
FIG. 10 is a characteristic graph representing the relationship between the heat-treatment temperature and the heat-treatment period of time, realized in the manufacturing method of the semiconductor device of the present invention shown in FIG. 1.

FIG. 10 is a characteristic graph showing the relationship between: a temperature (graduated on an x-axis of the graph), at which the heat treatment is carried out (hereinafter referred to as the processing temperature); and, a period of time (graduated on a y-axis of the graph), for which the heat treatment is carried out (hereinafter referred to as the processing time). As is clear from the above graph, the processing temperature and the processing time of such heat treatment are in inverse proportion to each other. Consequently, it is possible to decrease the processing time by increasing the processing temperature.

However, the processing temperature has its upper limit be approximately 700° C., which is determined by processing conditions of the heat treatment. When the heat treatment is carried out at temperatures exceeding the above upper limit, many problems such as a short channel effect and a punch-through phenomenon arise in MOS transistors forming the LSI, which causes deterioration in properties of the LSI.

As for a lower limit of the processing temperature in the heat treatment, when the processing temperature is excessively lowered, the effect of the heat treatment becomes poor and the processing time is excessively prolonged, which makes such heat treatment inadequate in operation. In view of the above fact, the lower limit of the processing temperature of the heat treatment is limited to approximately 400° C. Further, as for the processing time, in view of the upper and the lower limit of the processing temperature, it is preferable to select the processing time in a range of from 2 to 20 minutes.

Further, it is also preferable to form the amorphous metal film 7 over substantially the entire film thickness of the tantalum film 6. Incidentally, it is not necessarily required for the film thickness of the amorphous metal film 7 to be large, provided that the amorphous metal film 7 is continuously formed. For example, even the amorphous metal film 7 with a film thickness of its lower limit of approximately 20 angstroms may obtain a sufficient effect.

Next, the interlayer insulation film 5 having been contaminated through the individual process steps is removed. After that, using the sputter process, another interlayer insulation film 16 of silicon nitride having a film thickness of from 0.08 to 0.20 μm is newly formed. Then, using the sputter process, the solder layer 12 is formed in a manner such that the solder layer 12 extends to reach the surface of the interlayer insulation film 16 and to be connected with the end portion of the copper buried wiring 8. After that, the bump electrode 13 of copper is formed through the above solder layer 12, so that the semiconductor device of this embodiment is produced.

Figure 11:
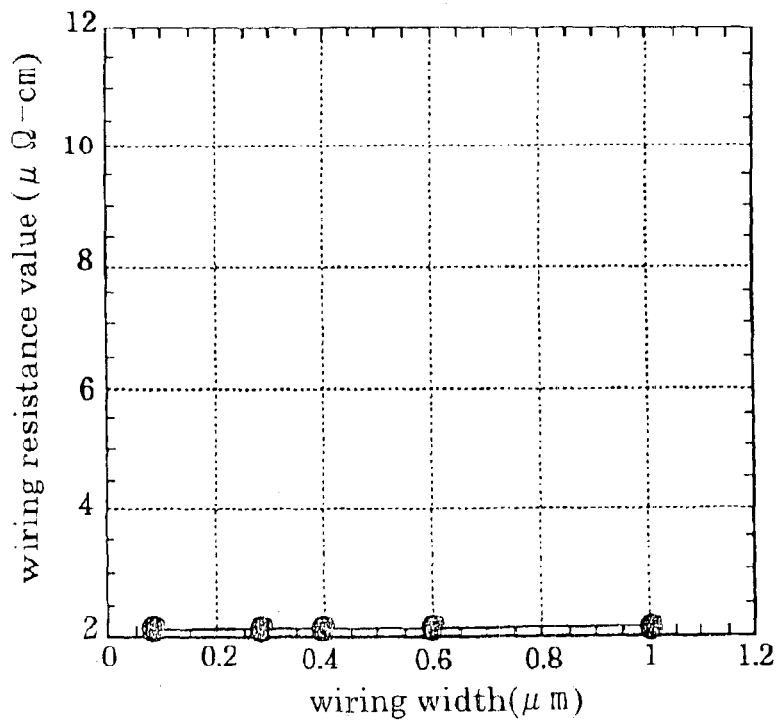
FIG. 11 is a characteristic graph representing the relationship between the wiring width and the wiring resistance, obtained in the first embodiment of the present invention shown in FIG. 1.
Figure 17:
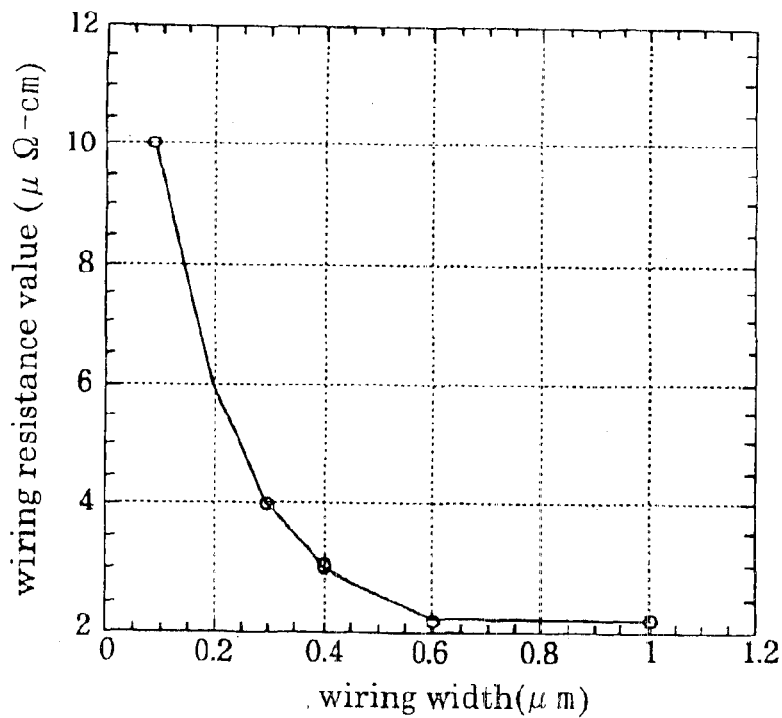
FIG. 17 is a schematic characteristic graph representing the relationship between the wiring width and the wiring resistance, obtained in the conventional semiconductor device.

FIG. 11 is a characteristic graph representing the relationship between the wiring width and the wiring resistance, obtained in this embodiment of the present invention. As is clear from comparison with the properties of the conventional example shown in FIG. 17, this embodiment of the present invention is capable of keeping the wiring resistance at a substantially predetermined relatively low value, regardless of variations in wiring width. On the other hand, in the conventional example, the wiring resistance varies in inverse proportion to the wiring width.

As described above, in this embodiment of the present invention in construction, since the amorphous metal film 7 is formed between the tantalum film 6 serving as a barrier metal film and, the copper buried wiring 8, the tantalum film 6 is brought into more intimate contact with the copper buried wiring 8. Due to this, it is possible to prevent the copper buried wiring 8 from peeling off, which improves the semiconductor device of the present invention in reliability. Due to this, it is possible for the present invention to produce a high-performance semiconductor device in an easy manner.

Further, since the tantalum oxide film 11 is formed between: the tantalum film 6 serving as a barrier metal film; and, the interlayer insulation film 3, it is possible for the tantalum film 6 to be brought into more intimate contact with each of the surface protection film 2 and the interlayer insulation film 3. Consequently, there is no fear that the copper buried wiring 8 tends to peel off.

Figure 12:
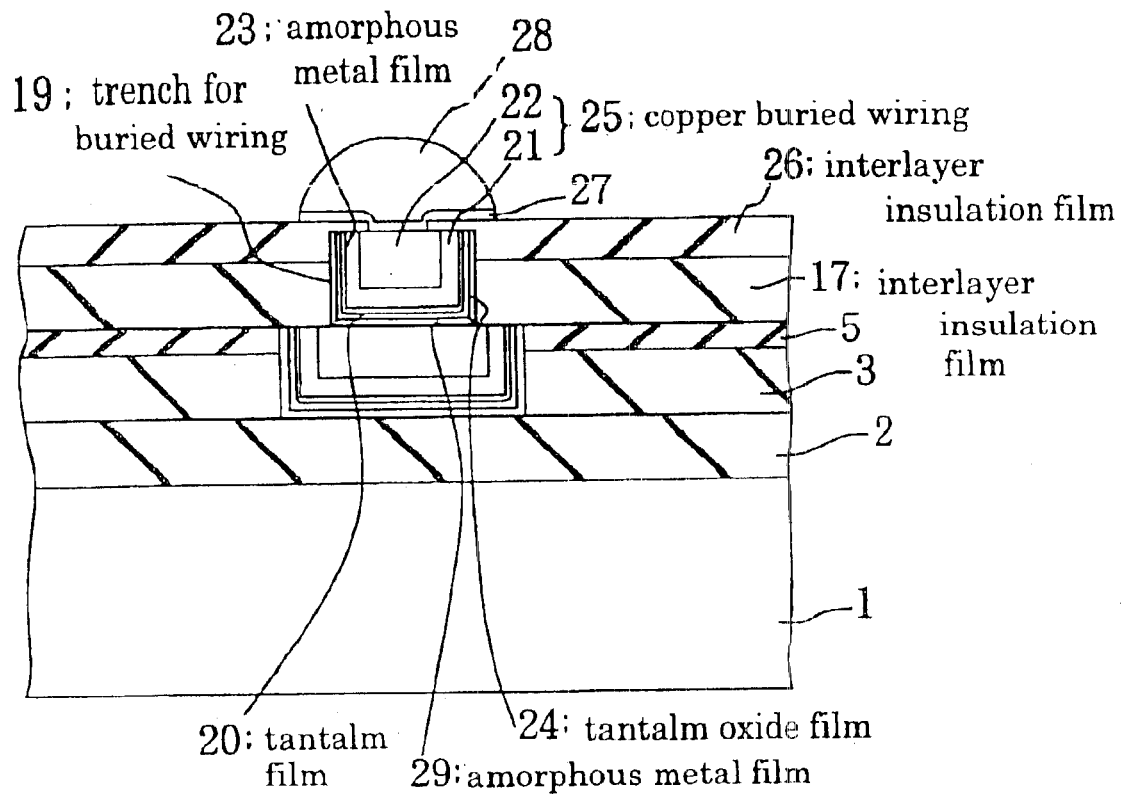
FIG. 12 is a cross-sectional view of a semiconductor device of a second embodiment of the present invention.
Figure 13:
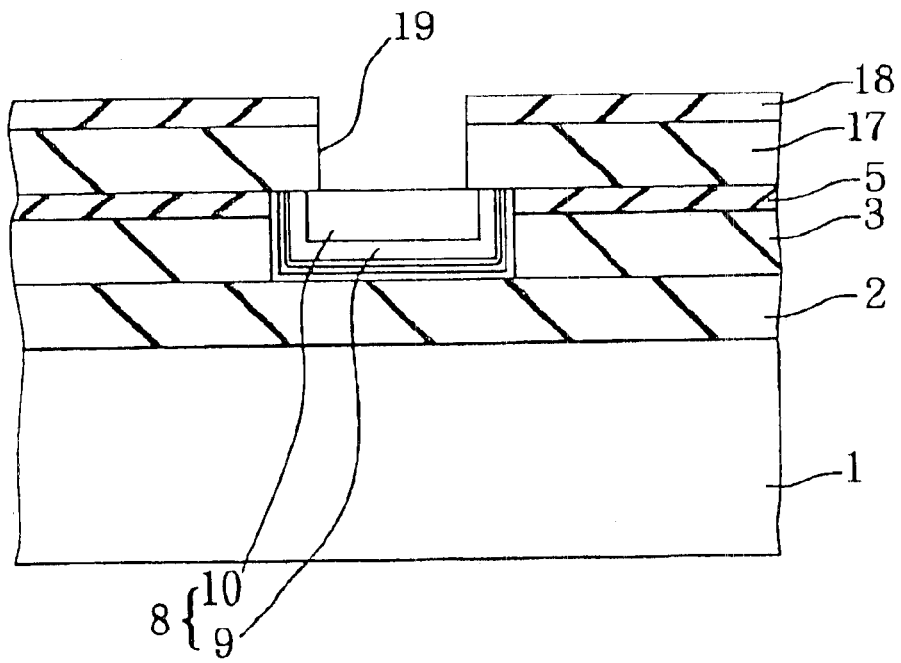
FIG. 13 is a cross-sectional view of the semiconductor device of the present invention shown in FIG. 12, illustrating the manufacturing method of the semiconductor device.
Figure 14:
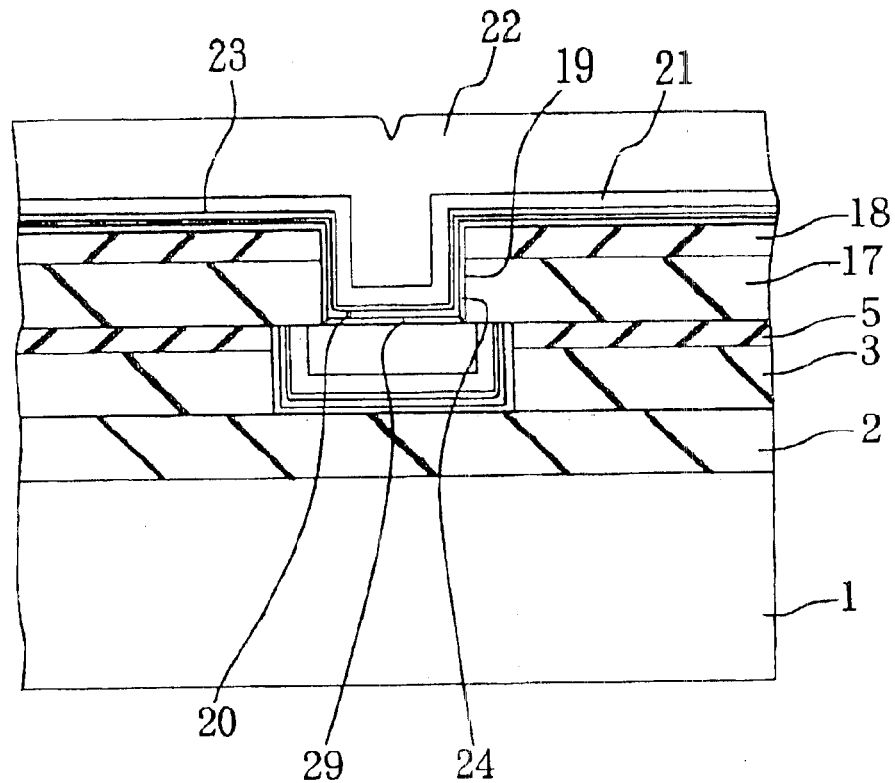
FIG. 14 is a cross-sectional view of the semiconductor device of the present invention shown in FIG. 2, illustrating the manufacturing method of the semiconductor device.
Figure 15:
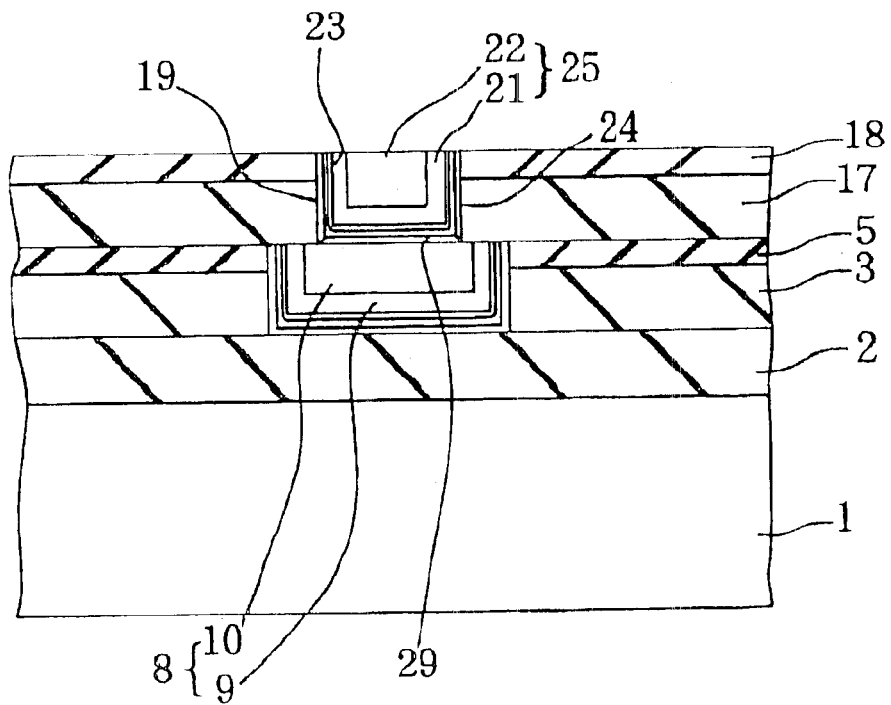
FIG. 15 is a cross-sectional view of the semiconductor device of the present invention shown in FIG. 2, illustrating the manufacturing method of the semiconductor device.
Figure 16:
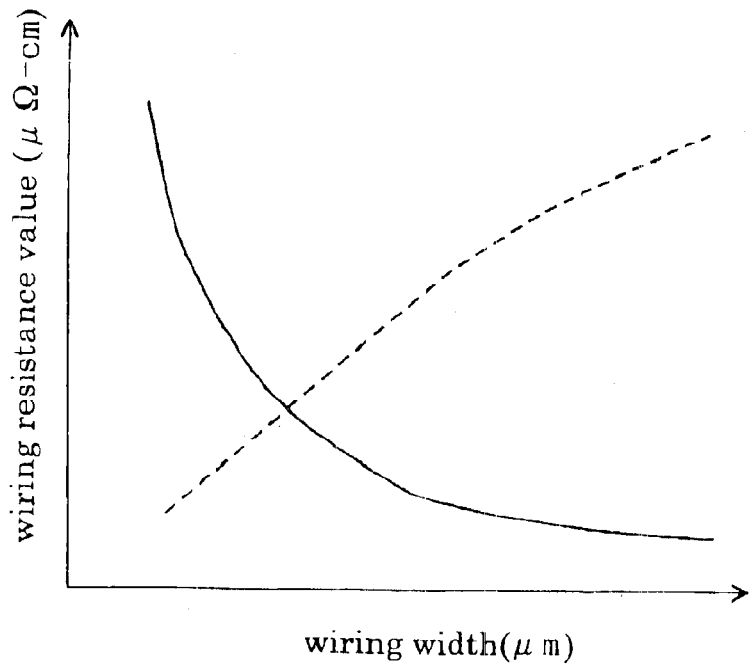
FIG. 16 is a characteristic graph representing the relationship between the wiring width and the wiring resistance, obtained in the second embodiment of the present invention shown in FIG. 2.

FIG. 12 shows the semiconductor device of a second embodiment of the present invention. FIGS. 13 to 15 are process charts following the order of process steps, illustrating the manufacturing method of the semiconductor device.

An essential difference between this second embodiment and the above first embodiment of the semiconductor device of the present invention is that the second embodiment uses a multi-layer construction (i.e., two-layer construction) in its copper buried wiring. In other words, when the copper buried wiring 8 of the first embodiment is called a first layer, the second embodiment of the present invention uses an additional (i.e., second) layer of copper buried wiring 25. Further, in the second embodiment of the present invention: an amorphous metal film 23 is formed between this copper buried wiring 25 and a tantalum film 20; a tantalum oxide film 24 is formed between the tantalum film 20 and an interlayer insulation film 17; and, another amorphous metal film 29 is formed between the first layer of copper buried wiring 8 and the tantalum film 20.

A solder layer 27 containing lead (Pb) and tin (Sn) is connected with an end portion of the second layer of copper buried wiring 25, and formed in a manner such that it extends from a part of a surface of an interlayer insulation film 26. Formed on this solder layer 27 is a bump electrode 28 of copper. This bump electrode 28 is used as an implementing electrode when the semiconductor device is implemented on the wiring substrate by a flip chip method.

Next, with reference to FIGS. 13 to 15, a manufacturing method of the semiconductor device of this embodiment will be described in the order of process steps of the method.

First, as shown in FIG. 13, by using the semiconductor substrate 1 obtained through the process steps shown in FIG. 8, the interlayer insulation film 17 of silicon oxide having a film thickness of from 0.8 to 1.5 μm is formed on the semiconductor substrate 1 by a CVD process. After that, another interlayer insulation film 18 of silicon nitride having a film thickness of from 0.08 to 0.12 μm is formed on the above interlayer insulation film 17 by the sputter process. Subsequent to this, by using a photolithography technology, a trench 19 having a diameter of approximately 0.25 μm designed for the buried wiring is formed in the interlayer insulation films 17, 18 so that the first layer of copper buried wiring 8 is exposed.

Next, as shown in FIG. 14, using a sputter process, the tantalum film 20 having a film thickness of from 200 to 500 angstroms and the copper thin film 21 having a film thickness of from 0.08 to 0.12 μm are sequentially formed on the trench 19 and the interlayer insulation film 18, wherein the trench 19 is designed for the buried wiring. After that, the copper thick film 22 having a film thickness of from 1.0 to 1.5 μm is formed on the copper thin film 21 by plating.

Next, by conducting the heat treatment under the same conditions as those shown in FIG. 7, the amorphous metal film 7 having a film thickness of approximately 20 angstroms is formed between the tantalum film 20 and the copper thin film 21. At the same time, the tantalum film 20 reacts with silicon oxide forming the interlayer insulation film 17 to form therebetween the tantalum oxide film 24 having a film thickness of approximately several angstroms. Further, at the same time, the amorphous metal film 29 is formed between the first layer of copper buried wiring 8 and the tantalum film 20. As described above, since the amorphous metal film 23 is formed between the tantalum film 20 and the copper thin film 21 while the amorphous metal film 29 is formed between the first layer of copper buried wiring 8 and the tantalum film 20, the tantalum film 20 is brought into more intimate contact with the copper thin film 21. In the same way, since the tantalum oxide film 24 is formed between the tantalum film 20 and the interlayer insulation film 17, the tantalum film 20 is also brought into more intimate contact with the interlayer insulation film 17.

Then, as shown in FIG. 15, using the CMP (i.e., Chemical Mechanical Polishing) process, the unwanted lump portion in surface of the copper thick film 22 disposed outside the trench 19 designed for the buried wiring is polished away so that planarization to a common level is achieved. In this polishing treatment, since the interlayer insulation film 18 of silicon nitride serves as a stopper, polishing operation stops at the surface of this interlayer insulation film 18. As a result, the second layer of copper buried wiring 25 is formed in the trench 19 designed for the buried wiring. Due to this, the second layer of copper buried wiring 25 is electrically connected with the first layer of copper buried wiring 8. As is in the case of the first layer of copper buried wiring 8 shown in FIG. 9, the second layer of copper buried wiring 25 is formed along the trench 19 designed for the buried wiring.

Next, the interlayer insulation film 18 is removed. After that, using the sputter process, another interlayer insulation film 26 of silicon nitride is newly formed. Then, using the sputter process, the solder layer 27 is formed in a manner such that the solder layer 27 extends to reach the surface of the interlayer insulation film 26 and to be connected with the end portion of the copper buried wiring 25. After that, the bump electrode 28 of copper is formed through the above solder layer 27, so that the semiconductor device of this embodiment is produced.

As described above, the second embodiment having the above construction is also capable of obtaining substantially the same effect as that of the first embodiment of the present invention.

In addition, since it is possible for this embodiment to form the amorphous metal film between the first layer of copper buried wiring and the tantalum film, the tantalum film is brought into more intimate contact with the copper buried wiring.

For example, though the tantalum film serving as a barrier metal film is described in the above embodiments, it is also possible to use any one of tantalum-base metals as a material of the barrier metal film. The tantalum-base metals may comprise tantalum compounds such as nitrides and silicon tantalum nitrides, in addition to tantalum itself.

Further, in addition to the above case where the copper buried wiring is formed in the trench designed for the buried wiring, it is also possible to apply the present invention to the case where a contact hole, a via hole and like holes are formed in the inter layer insulation film and a copper electrode serving as a plug electrode is formed in the contact hole, a via hole and like holes.

Further, the copper buried wiring may be made of pure copper or any one of copper alloys such as copper-Al alloys, copper-Ag alloys, copper-silicon alloys and the like.

In addition, the interlayer insulation film may be made of any one of BSG (Boron-Silicate Glass), PSG (Phospho-Silicate Glass), BPSG (Boron-Phospho-Silicate Glass), and the like, in addition to silicon oxides and silicon nitrides.

Further, the heat treatment may be carried out in any atmospheres other than an oxidizing atmosphere. For example, any inert atmospheres such as Ar (argon) atmosphere, He (helium) atmosphere and like inert atmospheres may be used in addition to $N_2$ atmosphere.

Further, the copper buried wiring may be of a multi-layer type in which the number of layers is equal to or more than three. In this case, the heat treatment is carried out under the above-mentioned conditions each time the copper buried wiring is formed.

Further, it is not necessarily required to use the interlayer insulation film of silicon nitride which serves as a stopper during the CMP (i.e., Chemical Mechanical Polishing) process.

Further, since the metal oxide film containing tantalum is formed between: the tantalum-base metal and the interlayer insulation film, the tantalum-base metal is brought into more intimate contact with the interlayer insulation film. Consequently, it is possible to prevent copper or copper-base conductive material from peeling off.

It is thus apparent that the present invention is not limited to the above embodiments but may be changed and modified without departing from the scope and spirit of the invention.

Finally, the present application claims the priority of Japanese Patent Application No. Hei 10-107514 filed on Apr. 17, 1998, which is herein incorporated by reference.

What is claimed is:

1. A method for manufacturing a semiconductor device that has a substrate with an interlayer insulation film thereon, the interlayer insulation film having therein a contact hole, a via hole, or a trench for a plug electrode or buried wiring, wherein the contact hole, via hole, or trench is lined with a tantalum oxide film, a tantalum-base barrier film, an amorphous metal film, and a copper-based conductive film and is filled with the copper-based conductive film to form a plug electrode or buried wiring, the method comprising the steps of:

preparing a semiconductor substrate, formed in which is the interlayer insulation film provided with the contact hole, via hole, or trench;

forming the tantalum-base barrier film in the contact hole, via hole or trench;

forming the copper-based conductive film on the tantalum-base barrier film; and forming the tantalum oxide film between the interlayer insulation film and the tantalum-base barrier film at an interface surface therebetween and at a same time forming the amorphous metal film comprising tantalum and copper between the tantalum-base barrier film and the copper-based conductive film at an interface surface therebetween by heat treating the semiconductor substrate with the tantalum-base barrier film and the copper-based conductive film in a non-oxidizing atmosphere.

2. A manufacturing method of the semiconductor device, according to claim 1, wherein:

in the step of heat-treating said semiconductor device, said semiconductor device is a heat-treated at a heat-treatment temperature of from 400 to 700° C. for a heat-treatment period of from 2 to 20 minutes.

3. The method according to claim 1, wherein the copper-based conductive film is formed by using a first step of forming a copper-based thin film on the tantalum-base barrier film, and a second step of forming a copper-based thick film on the copper-based thin film.

* * * * *